United States Patent [19]

Strasser et al.

[11] Patent Number: 5,017,073
[45] Date of Patent: May 21, 1991

[54] TRANSPORT SYSTEM FOR CONVEYING WORKPIECE BETWEEN FIRST AND SECOND MEDIA

[75] Inventors: Gregor Strasser, Vaduz, Liechtenstein; Gerald Zöhrer, Weite, Switzerland; Roman Schertler, Wolfurt, Austria; Heinrich Fischer, Triesen, Liechtenstein

[73] Assignee: Balzers Aktiengesellschaft, Balzers, Liechtenstein

[21] Appl. No.: 434,417

[22] Filed: Nov. 9, 1989

[30] Foreign Application Priority Data

Nov. 17, 1988 [CH] Switzerland ..................... 4267/88

[51] Int. Cl.$^5$ .............................................. B65G 49/07
[52] U.S. Cl. .................................................. 414/217
[58] Field of Search ................ 414/217, 219, 220, 221

[56] References Cited

U.S. PATENT DOCUMENTS

| | | | |
|---|---|---|---|
| 4,433,951 | 2/1984 | Kock et al. | 414/217 |
| 4,534,314 | 8/1985 | Ackley | 414/217 X |
| 4,553,069 | 11/1985 | Purser | 315/111.81 |
| 4,584,045 | 4/1986 | Richards | 414/217 X |
| 4,670,126 | 6/1987 | Messer et al. | 204/298 |
| 4,705,951 | 11/1987 | Layman et al. | 414/217 X |
| 4,715,764 | 12/1987 | Hutchinson | 414/217 |
| 4,733,746 | 3/1988 | Nozaki et al. | 118/50.1 |
| 4,746,256 | 5/1988 | Boyle et al. | 414/217 |
| 4,828,224 | 5/1989 | Crabb et al. | 414/217 X |
| 4,857,160 | 8/1989 | Landau et al. | 204/192.12 |
| 4,861,563 | 8/1989 | Slekerjian et al. | 414/217 X |
| 4,917,556 | 4/1990 | Stack et al. | 414/217 |

FOREIGN PATENT DOCUMENTS

| | | |
|---|---|---|
| 0242997 | 3/1987 | European Pat. Off. . |
| 0246798 | 5/1987 | European Pat. Off. . |
| 3801998 | 5/1989 | Fed. Rep. of Germany . |
| 2143494 | 1/1982 | United Kingdom . |

*Primary Examiner*—F. J. Bartuska
*Assistant Examiner*—John VandenBosche
*Attorney, Agent, or Firm*—Notaro & Michalos

[57] ABSTRACT

A lock chamber for conveying a workpiece from one medium ($U_0$) into another medium ($U_7$) which comprises a lever (11) acting as a transport system and pivotably mounted in the chamber on one side. With lock gates (5a, 5b) moves aside the lever (11) can swing out by a required degree into the respective media ($U_7$, $U_0$). With the design of the transport system as unilaterally mounted levers (11), the volume of the lock chamber is largely independent of the trajectory of the lever and the volume can be minimized (FIG. 1).

16 Claims, 3 Drawing Sheets

TRANSPORT SYSTEM FOR CONVEYING WORKPIECE BETWEEN FIRST AND SECOND MEDIA

FIELD AND BACKGROUND OF THE INVENTION

The present invention relates to a transport system for conveying a workpiece from a first medium or chamber into a second medium or chamber, essentially without one affecting the other. Further it relates to a method for charging and unloading a treatment chamber with a selected treatment atmosphere differing from the chamber medium.

Further the present invention relates also to a vacuum chamber with a transport system as mentioned, as well as use of the transport system or of the vacuum chamber.

A transport system is known from European Patent Application EP-A-0 242 997 for transferring workpieces from a workpiece magazine of a first medium into a treatment chamber, such as a vacuum chamber, of a second medium, thence into a third medium, etc. The transport system from one chamber into the other comprises a two-armed lever which is disposed between the chambers and can be flapped into both. This lever is integrated in a sealed valve arrangement by means of which the chambers can be separated from or connected with each other under seal. This sealing valve arrangement is designed similar to a gate, so that the two respective chambers and hence their atmospheres are either connected or separated from each other.

Such a transport system has the disadvantage that with each lever rotation into one of the two respective chambers the two chambers are connected, whereby an equalization of the respective atmospheres occurs. If it is necessary to work in one of the chambers with an operating atmosphere that is kept within narrow tolerances, this procedure requires that after each transport process involving the two chambers, the chamber must be conditioned anew.

Hence the transport system shown there is unable to convey a workpiece from a first to a second medium substantially without one affecting the other.

Further it is known from European Patent Application EP-A-0 246 798 to provide transport levers inside each of a set of serially connected treatment chambers, a lever in a particular chamber operating in said chamber as well as reaching over into the next chamber. Here, too, two treatment chambers in question communicate during a transport process involving them, so that thereafter, because of their atmosphere having been influenced by adjacent chambers, the respective chambers must be conditioned anew if the treatment atmospheres of each of the chambers in question must be maintained within narrow tolerances and the atmospheres in the chambers in question are different.

Likewise, it is known from U.S. Pat. No. 4,553,069 to provide, in a vacuum chamber, a pantograph-like, multi-armed transport lever mechanism. To remove workpieces to be treated, such as wafers, from a magazine, one reaches from the vacuum chamber through a then open slot valve into the magazine, whereby again a connection is established between magazine and vacuum chamber, and this makes it necessary, in the case where delicate vacuum conditions must be maintained within narrow tolerances, to condition the vacuum chamber anew after a transport process.

In addition, providing the transport arm with associated parts in the vacuum chamber, as in EP-A-0 246 798 also, results in a relatively large chamber volume with a respective cost due to pumping capacity and conditioning times, since the volume in the vacuum chamber that is made available for the transport system, must be conditioned as well.

Also from U.S. Pat. No. 4,670,126 it is known to provide, in an intermediate chamber between several treatment chambers, a multi-armed transport lever which can selectively reach into one of the existing connected treatment chambers, via gates with slit-valve type closures. The multi-armed transport lever which is able to extend into the connected chambers results in a relatively large volume for the intermediate chamber, which, during each transport to one of the connected treatment chambers, communicates with that chamber, so that interaction of atmospheres takes place and hence after each such transport process the respective treatment chamber must be conditioned anew, and possible also the intermediate chamber.

From U.S. Pat. No. 4,733,746 it is further known to charge a vacuum treatment chamber bilaterally via two vacuum antechambers, by means of a transport system which is not shown in detail in that reference.

Further a specific transfer cycle is described, from an antechamber into the vacuum chamber and into the next antechamber, all three chambers being connected together, whereby relatively large volumes, namely those of the intermediate chambers, affect the vacuum chamber.

U.K. Patent Application GB-2 143 494 discloses a transport system consisting of a lock chamber in which a two armed pivoting lever is mounted substantially centrally in the chamber and can be moved out through conventional slit valves. As the two arms of the transport lever are driven separately, the receiving end portion of the lever can be controlled in practically any curvilinear path. On the other hand, this transport system is disadvantageous in the sense that the drive and the respective lead-throughs for the two lever arms are extremely complicated with respect to vacuum tightness and that the chamber is relatively big, adversely affecting pump units to be installed or their capacity and operating times.

Further, reference is made to European Patent Application EP-OS 0 291 690.

SUMMARY OF THE INVENTION

It is the object of the present invention to provide a transport system of the initially mentioned kind where only minimal volumes must be conditioned after a transport process from one medium to the other medium, thereby greatly reducing the cycle time, with the further object of optimizing this cycle time by a controlled transport rhythm. To fulfil these objects, the inventive system comprises:

a lock chamber for separating the first medium from the second medium, the lock chamber having an edge region at one end thereof and openings on opposite sides thereof;

at least one transport lever pivotally mounted in said lock chamber at a pivot point adjacent said edge region thereof, said transport lever having a workpiece receiving portion spaced away from said pivot point; and a pair of lock gates, each mounted for movement to open and close one of said side openings of said lock chamber, said side openings being positioned so that said receiving portion of said transport lever can be swung out of said chamber and through one of said openings at a time for extending into the first and second media.

The inventive method for conveying comprises, to fulfil the above mentioned objects:

positioning at least two lock chambers having side openings and edge regions, between the treatment chamber and the ambient atmosphere;

establishing substantially the treatment atmosphere in one of the lock chambers and substantially the ambient atmosphere in the other of the lock chambers;

communicating one side of the one lock chamber with the treatment chamber, and communicating one side of the other lock chamber with the ambient atmosphere;

conveying at least one of a workpiece which has been treated from the treatment chamber into the one lock chamber and of a workpiece to be treated from said one lock chamber into said treatment chamber and conveying at least one of a workpiece which has not been treated from the ambient atmosphere into the other lock chamber and of a workpiece which has been treated from the other lock chamber into the ambient atmosphere; and sealing off each of the one and other lock chambers followed by establishing the ambient atmosphere in the one lock chamber and establishing the treatment atmosphere in the other lock chamber for conveying and treatment of subsequent workpieces.

Differently from known transport systems of the aforesaid kind which lead to treatment chambers communicating with one another in transport cycles, here a procedure according to U.S. Pat. No. 4,733,746 is taken as a starting point where, for example, in vacuum treatment processes the workpieces are introduced into a vacuum chamber by means of airlocks. The transport systems comprise locks for introducing a workpiece into such a treatment medium chamber while separating the treatment medium prevailing in the chamber from the medium outside the chamber.

According to the known mode of operation, such airlocks are first opened on one side, a workpiece is brought into the lock using a transport lever, then the lock is closed and the ambient condition in the lock chamber is adapted to the ambient condition in the treatment chamber. If influences of the medium outside the treatment chamber must be prevented from affecting the conditions inside the treatment chamber, the lock chamber is closed on both sides, evacuated, and brought to the same ambient conditions which prevail in the treatment chamber before the lock is opened toward said treatment chamber. Then the workpiece is introduced into the treatment chamber by means of the transport system. If the gas volume enclosed in the lock chamber can be tolerated in the treatment chamber, then, after introduction of the workpiece into the chamber, the lock chamber is opened only toward the treatment chamber and the workpiece is introduced.

In both cases, attention must be paid to the volume of the lock chamber. While in the first case the cycle time and the evacuating and conditioning units to be provided depend mainly on the lock chamber volume to be evacuated and conditioned, in the second case the lock chamber volume influences the degree to which the conditions in the treatment chamber are influenced by the volume enclosed in the lock chamber.

Due to the fact that inventively a lever is pivotably mounted in the edge region of the lock chamber in the transport system according to the present invention and the lock chamber includes the lock gates on either side of the pivot bearing for the lever so that the lever portion spaced away from the bearing can be swung out of the chamber to both sides, when the lock gate is open in each instance, the greatest possible swivel path can be covered with this lever for a given chamber volume, and hence, conversely, with a given swivel path a minimum lock chamber volume is obtained.

Due to the fact that the transport system comprises a lever thus pivotably mounted in the lock chamber, it becomes possible, in other words, to limit the chamber volume by the extent of the lever in the azimuthal direction relative to the swivel bearing and on the other hand to determine the transport path to be traveled by the transport system by the radial extent of the lever. As has been mentioned, it thus becomes possible to make the chamber volume largely independent of the transport distance to be traversed.

According to one feature of the invention, preferably the lock gates, viewed in the direction of the swivel bearing axis, are arranged so that they border an area which is given essentially by the form of the lever and of a workpiece to be transported. This area is thereby reduced to a minimum.

Since side lock gates are provided for clearing the circular swivel path of the lever, it is further proposed according to another feature of the invention to form the lock gates as slit valves, preferably MONOVAT (a tradename) valves of the firm V.A.T. (Vakuum Apparate Technik of 9469 The Haag, Switzerland).

In principle, these are slit valves where the valve slide is moved in gate fashion up and down in one direction only, no second movement perpendicular to the closing and opening movement being necessary to establish or to break the seal. Such valves thus offer substantial advantages over "dual motion slot valves" with respect to tool life and in particular with respect to minimizing wear and abrasion. The valves used according to the invention are described for example also in German Patent laid open print DE-OS 38 01 998.

In order to shorten the work cycle for a workpiece to be treated in the treatment chamber, in particular a vacuum chamber, it is proposed according to one aspect of the invention to provide a pair of lock chambers of the mentioned kind and to operate them in push-pull fashion. This means that when the lever of one lock chamber engages into the medium of the outside treatment chamber, the lever of the other lock chamber is in the treatment chamber, and when both levers are brought back into the corresponding lock chambers, one chamber is brought to the conditions outside the treatment chamber, while the other is brought simultaneously to the conditions corresponding to the interior of the treatment chamber. Thereby the run-through time for the workpieces through the treatment process is shortened.

In many cases, it is further desirable not to have to supply the workpieces to be continuously fed to the treatment chamber to two separate receiving positions for each of the existing transport systems, but to be able to receive workpieces -with both transport systems at the same position lying outside the treatment chamber and/or to be able, within the treatment chamber, to bring the respective workpieces into the same treatment position with both transport systems.

In a further form of the transport system, according to the invention, this is readily possible in that the circular path areas swept by the levers overlap at least in one of the two media.

If it is desired to be able to charge the same treatment position in the treatment chamber with both transport systems as well as to operate outside the treatment chamber from or on the same charging station or removal station respectively with both transport systems, the circular path areas swept by the levers overlap in both media.

Preferable this is achieved in that the two lock chambers are juxtaposed so that the swivel bearing are adjacent each other.

Further a vacuum chamber with a transport system is included as part of the present invention. Such a vacuum chamber is suitable in particular for the coating of memory discs, where such substrates for the vacuum deposition of metals, e.g. aluminum or aluminum alloys, are introduced into this vacuum chamber of the invention with the lock chambers provided according to the invention. With such a vacuum chamber one of the production stages of the entire production line becomes much faster, whereby, in view of the fact that the vacuum process stage has heretofore been one of the slower ones in the production stage chain, total manufacturing time is shortened. Due to the mentioned possibility of serving workpieces such as discs with the new transport system, both outside the vacuum chamber and inside the treatment chamber using the same transfer, delivery or treatment stations, the handling of the supplied workpieces and hence the loading devices to be provided become especially simple and cost-effective, in that in particular for the chamber charging operations, the discs can be transferred to the respective transport lever at a single point in a freely accessible manner.

Further, according to the invention, only one or two workpieces, e.g. CDs, are introduced from the transfer point into the vacuum treatment process at any one time. This is without reducing cycle time. In case of failure of the total process thus, the installation can be stopped at any time, without having a large number of discs already involved in the vacuum coating process and having to discard them when the installation is started up again. Nor must the process wait until many workpieces already involved in the treatment process in the installation have left the vacuum treatment process, i.e. the vacuum chamber, before restarting the total process.

Due to the extremely simple design of the transport system with swivel lever it is readily possible to change the workpiece size, as in particular in memory disc production the two common sizes of e.g. 80 and 120 mm diameter or larger.

In the transport system according to the invention it is desirable in some cases to bring the workpieces which have been introduced by the two levers at the lock chambers into one medium, in particular the treatment medium, not only in the same position, but in the same absolute orientation. In fact, it should be stressed that in the context of the present invention workpiece means not only an undivided part, but a unit, jointly conveyed by one of the levers, which may very well consist of several discrete parts to be treated simultaneously.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

The invention will be explained below by way of example with reference to the drawings in which.

DESCRIPTION OF THE PREFERRED EMBODIMENTS

Figure 1:
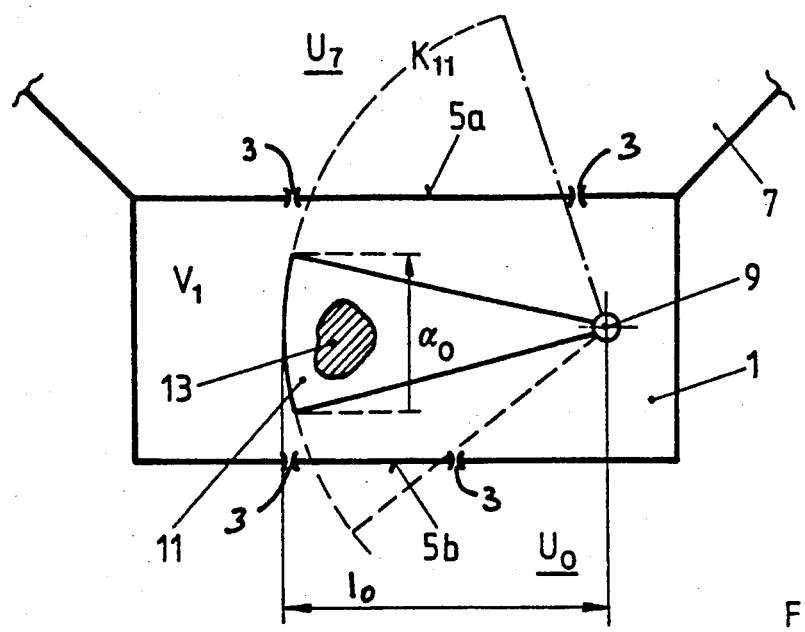
FIG. 1 is a schematic diagram of a lock chamber according to the invention showing the basic design according to the invention.

FIG. 1 schematically illustrates a lock chamber 1 according to the invention. Lock chamber 1 has sealed opening edges 3, at which are provided two lock gates 5a and 5b in a manner to be described later. Lock gate 5a separates the interior of lock chamber 1 having volume $V_1$ from a first environment $U_7$ which prevails in a treatment chamber 7 shown only partially. The treatment chamber 7 may be in particular a vacuum treatment chamber. The second lock gate 5b separates the interior of chamber 1 from a second environment $U_0$, for example the external medium of treatment chamber 7. A transport system in the form of a lever 11 is mounted for swivel movement about an axis 9 in lock chamber 1. Lever 11, as only one of many possible embodiments, has a circular sector form.

By rotating about the axis 9, lever 11 sweeps a circular area shown in broken lines at $K_{11}$, so as to convey a workpiece 13, which preferable is carried at the end of lever 11 away from the pivot axis 9, back and forth between medium $U_7$ and medium $U_0$. Depending on how far lever 11 is to be movable into medium $U_7$ or $U_0$ respectively to bring workpiece 13 into the respective media to predetermined positions, the lock gates 5a and 5b are dimensioned longer or shorter.

In FIG. 1 a shorter excursion into medium $U_0$ is required than into medium $U_7$, and accordingly gate 5b may be made shorter than gate 5a.

The operation of an airlock is known in itself, so that it suffices to discuss it only briefly. After the workpiece in medium $U_0$ has been placed on lever 11 which has been pivoted out to it, the workpiece is transported through the open lock gate 5b into the interior of chamber 1. Thereupon gate 5b is shut against medium $U_0$ under seal and the internal volume $V_1$ of chamber 1 is then evacuated and conditioned to the conditions prevailing in medium $U_7$ if the conditions of medium $U_0$ would exert an undesired effect on the conditions in medium $U_7$. Otherwise the conditions, corresponding to $U_0$, existing in the interior of the lock chamber with gate 5b open are left there. Thereafter, in each of the two cases, lock gate 5a is opened and the workpiece 13 is transported by lever 11 which is swung out farther into medium $U_7$ or respectively into the treatment chamber 7.

It is evident therefrom that when an influence of medium $U_0$ on medium $U_7$ is to be prevented, the internal volume $V_1$ of the lock chamber must be evacuated and conditioned. And if, for example because of toxicity of medium $U_7$, it is to be prevented also that in the reverse cycle medium $U_7$ influences medium $U_0$, then chamber 1 containing the internal volume $V_1$, must be evacuated twice, when introducing workpiece 13 into $U_7$ and when fetching a new workpiece by moving lever 11 back into medium $U_0$.

On the other hand, if in principle a certain influence of medium $U_0$ on medium $U_7$, or possibly vice versa, is acceptable, it is evident that the degree of this influence also depends on the volume $V_1$ since this volume must not exceed a certain predetermined magnitude, in particular with respect to the volume of treatment chamber 7.

Hence the decisive factor in all cases is to keep the necessary volume $V_1$ of lock chamber 1 as small as possible, while yet being able to steer the lever toward the required positions in both media $U_0$ and $U_7$.

As can be seen from FIG. 1, the lock volume $V_1$ is determined firstly by the represented elevation contour and, or course, its structural height. Now the elevation contour when the lever position is moved into chamber 1 is measured along the maximum azimuthal extend $alpha_o$ of lever 11 or of workpiece 13 if the latter projects over the lever. The possible transport path, however, depends on the radial length $l_o$ of lever 11, and thus the volume of lock chamber 1 can be laid out largely independent of the transport path to be traveled, by minimizing $alpha_o$ with the required length $l_o$.

Figure 2:
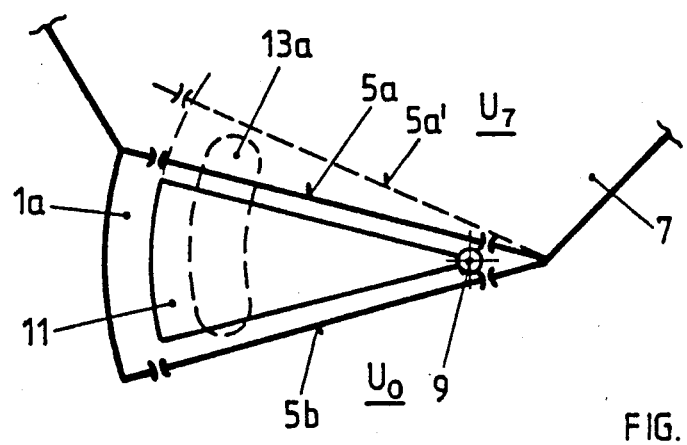
FIG. 2 is a view which is analogous to FIG. 1, showing the schematic construction of a lock chamber according to the invention with minimalization of the lock chamber volume.

FIG. 2 illustrates how minimization of the lock chamber volume is obtained, although in some cases the minimum will not be necessary. If, as shown already in FIG. 1, lever 11 is again mounted to pivot about axis 9 in a lock chamber 1a and is given a circular sector form, then chamber 1a is also given a circular sector-shaped plan, in that the two lock gates 5a and 5b are arranged substantially to match the form of lever 11, hence here substantially parallel to the legs of the sector. If, as shown in broken lines at 13a, workpieces which project over the aziumthal extent of lever 11 must be transported from $U_0$ to $U_7$ or vice versa, then of course the form of lock chamber 1a must take this into account, as illustrated at 5a'.

Figure 3:
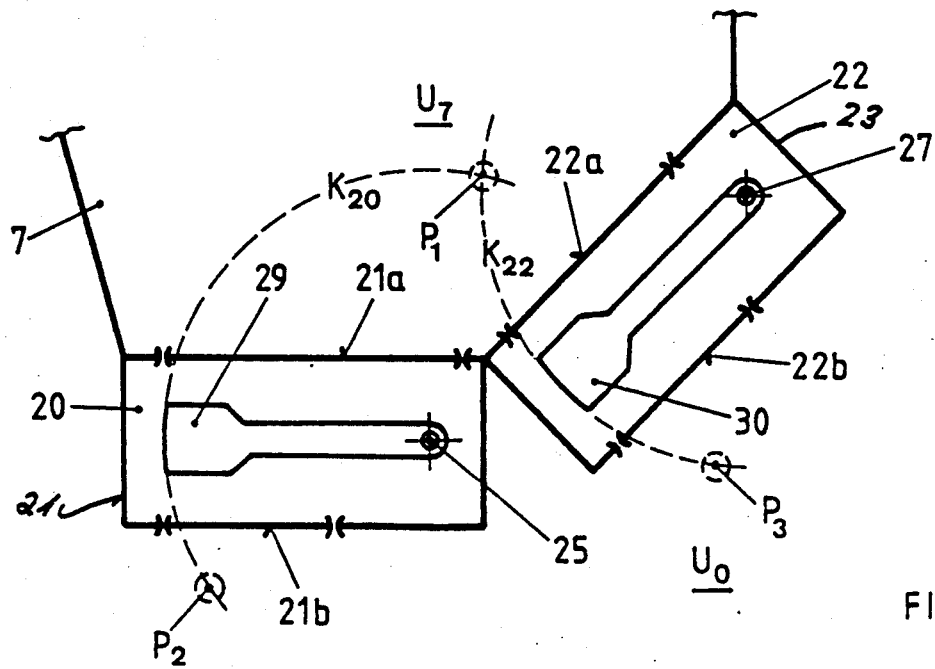
FIG. 3 is a schematic diagram of two lock chambers according to the invention, the movement paths of the transport systems overlapping in one of the two media to be charged through the lock chambers.

FIG. 3 shows a lock chamber arrangement with two lock chambers 20 and 22 according to the invention. The respective walls 21, 23 of the lock chambers have lock gates 21a, 21b and 22a, 22b, respectively, so that the two lock gates 21b and 22b seal the interior of lock chambers 20 and 22 against the medium $U_0$, and the lock gates 21a and 22a seal the chambers against the medium $U_7$ inside the treatment chamber 7.

Both lock chambers 20 and 22 again have, as transport system, a lever 29, 30 rotatable about an axis 25, 27. Depending on the desired length of excursion along paths $K_{20}$, $K_{22}$, the respective lock gates are dimensioned accordingly. As can be seen from FIG. 3, the two lock chambers 20, 22, with the arrangement of their pivot axes 25, 27, the length of their levers 29, 30, and the intended swivel angles, are laid out so that the swept circular areas $K_{20}$, $K_{22}$ overlap at $P_1$. This overlap zone $P_1$ is provided for example in FIG. 3 inside the treatment chamber 7, so that e.g. with lever 29 a workpiece can be conveyed from a receiving position $P_2$ in medium $U_0$ into the treatment position $P_1$ in treatment chamber 7 and can, after treatment, be taken up by lever 30 and conveyed into the removal position $P_3$ in medium $U_0$. Naturally the two positions $P_2$ and $P_3$ may lie in two different media and accordingly the lock chambers 20, 22 can separate three different media, so that the workpiece is conveyed from $P_2$ in one medium to $P_1$ in the second medium, and then to $P_3$ in a third medium.

FIGS. 4a to 4f show a vacuum chamber according to the invention with a lock chamber arrangement according to the invention, for applying a reflective layer onto a plastic substrate of a compact disc which is used as the workpiece. The vacuum chamber here is the treatment chamber. Two lock chambers 32a and 32b according to the invention are disposed adjacent a vacuum chamber 31. Each chamber 32a and 32b has a pair of lock gates 34a, 34b and 35a, 35b. Just as in the previously described embodiment these lock gates may be of the so-called slit valve type such as those manufactured and sold by the firm V.A.T. under the designation MONOVAT. The two lock chambers hermetically seal the vacuum chamber medium $U_{31}$ from the external medium $U_0$.

In each lock chamber 32a and 32b, a spoon-shaped transport lever 36a, 36b is mounted to swivel about pivot axes 38a, 38b, the pivots being adjacent each other. Each of the two lock chambers has an evacuating valve 40a, 40b as well as a valve 42a, 42b toward the atmosphere or environment. The lines associated with the evacuation valves 40a and 40b each lead to vacuum sources 44a, 44b.

Further an argon tank 46 is provided in the vacuum chamber 31 for the vacuum deposition process here in question and is connected to the vacuum chamber 31 via a controllable valve 48. To evacuate the vacuum chamber 31, a vacuum source 52 is connected to chamber 31 via a valve 50.

Referring to FIGS. 4a to 4f, the operation of such a vacuum chamber 31 according to the invention with the lock chambers 32a and 32b according to the invention, will now be explained.

Figure 4A:
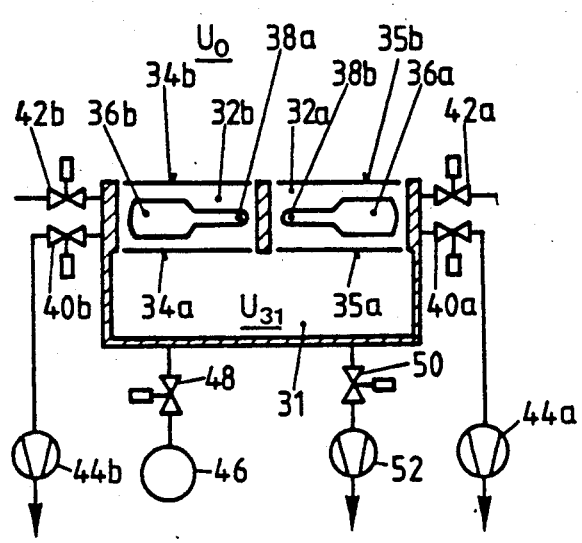
FIG. 4a to FIG. 4f are schematic diagrams showing different positions for a vacuum chamber according to the invention with a lock chamber arrangement consisting of lock chambers according to the invention for the vacuum coating of memory discs, e.g. CDs.

FIG. 4a shows the starting position of chamber 31. Lock chamber 32a is closed on both sides with slot valves 35a, 35b. Slit valve 34a of chamber 32b is likewise closed. While slot valve 34b may be open or closed, it is shown closed in FIG. 4a.

By opening valve 50 and actuating the vacuum source 52, vacuum chamber 31 is evacuated and conditioned to the required argon atmosphere from argon tank 46 via valve 48. At the same time the right-hand lock chamber 32a is evacuated via evacuation valve 40a. The two transport levers 36a and 36b, still empty, lie inside the lock chamber 32a and 32b.

Figure 4B:
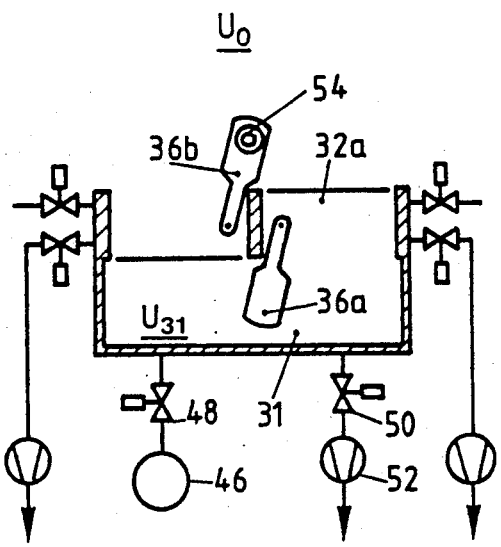

According to FIG. 4b, after closing the valves 48 and 50 to stop the vacuum source 52, the slot valve 35a of the right lock chamber 32a is opened, as shown, and transport lever 36a, still without workpiece, is swung into vacuum chamber 31. At the same time, slit valve 34b having been opened, the transport lever 36b is swung into medium $U_0$, where it picks up an as of yet uncoated memory disc, such as a compact disc 54.

Figure 4C:
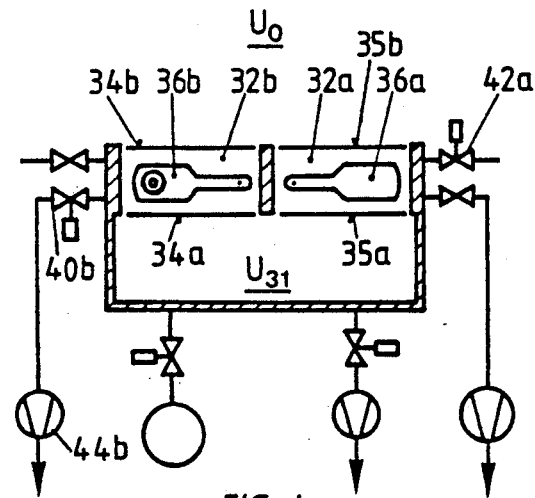

As per FIG. 4c, lever 36b is thereafter swing back into its lock chamber 32b, and at the same time lever 36a is swung into its lock chamber 32a, whereupon all slit valves 35a,b and 34a,b are closed. Now by means of the vacuum source 44b, valve 40b having been opened, the left lock chamber 32b is evacuated, and at the same time, by opening valve 42a, the right lock chamber 32a is placed at ambient pressure corresponding to $U_0$.

Figure 4D:
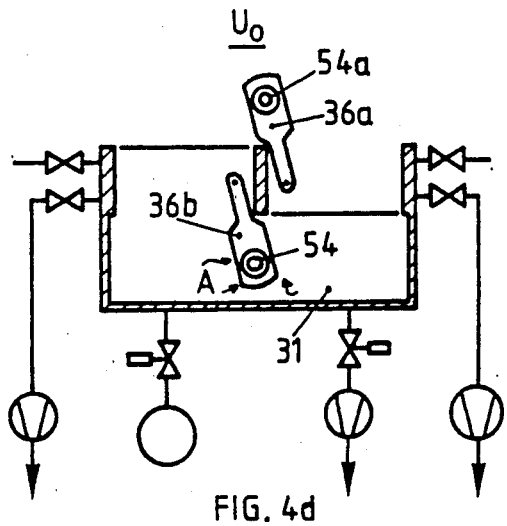

Thereafter, changing over to the configuration per FIG. 4d, slit valves 34a and 35b are opened, the transport lever 36b which was loaded with the as of yet uncoated disc 54 is swung into vacuum chamber 31, and the as of yet unloaded transport lever 36a is swung out into medium $U_0$. As can be seen, the uptake or receiving portion of the spoon-shaped lever 36a then occupies the same receiving position which was previously occupied by the receiving portion of the spoon-shaped transport lever 36b as shown in FIG. 4b.

The uncoated disc 54 is treated in the vacuum chamber 31 for example by vacuum deposition of aluminum alloy, as represented schematically by A in FIG. 4d. At the same time, another uncoated disc 54a is placed on the transport lever 36a by a loading apparatus not of interest in connection with the present invention. Thereafter the two transport levers 36 swing back into the position shown in FIG. 4e, lever 36b carrying the coated disc 54 while lever 36a carries the disc 54a which is still to be treated.

Figure 4E:
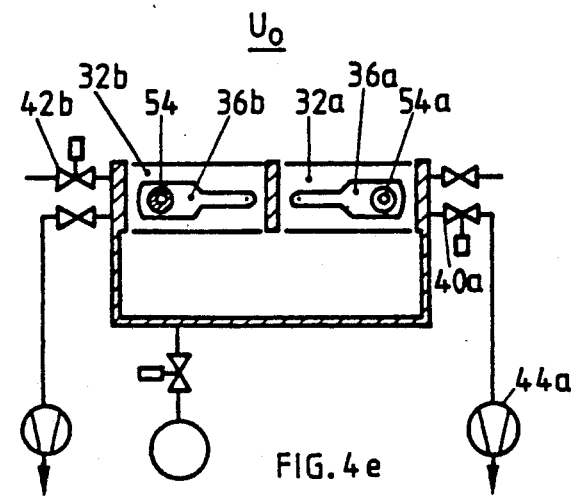

In FIG. 4e all slot valves are closed, the left lock chamber 32b being placed at ambient pressure corresponding to $U_0$ by opening valve 42b. At the same time the right lock chamber 32a is evacuated by opening valve 40a and actuating the vacuum source 44a. Now, changing over the configuration of FIG. 4f, the left transport lever 36b is brought into medium $U_0$, i.e. the removal position for the coated disc 54, which is also the receiving position for the discs to be coated, as a cross comparison of FIGS. 4f, 4d and 4b will show; both levers 36 pick up discs to be coated at the same position in medium $U_0$ and also lay them down again there.

Figure 4F:
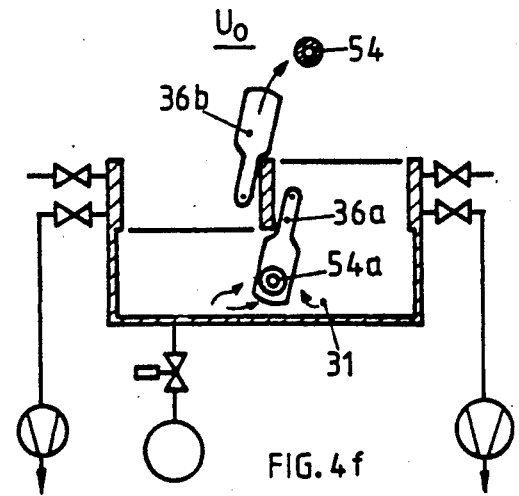

Coming back to FIG. 4f, simultaneously with the opening of slit valve 34b the slot valve 35a of the right lock chamber 32a is opened and the right transport lever 36a is swung into the vacuum chamber 31 for the treatment of disc 54a.

Also the treatment positions for the discs, such as CDs, to be coated in vacuum chamber 31 are the same for both transport levers, as the cross-comparison will show.

The disc-coating process continues cyclically, i.e. during the coating of disc 54a lever 36b picks up a new disc to be coated, etc.

In FIGS. 4b to 4f only the reference symbols mentioned in their description have been entered, the others are evident from the representation of FIG. 4a. It goes without saying that the argon atmosphere in vacuum chamber 31 is kept constant and it is readily evident that, according to the invention, both lock chamber 32a and 32b are dimensioned to minimum volume, so that the respective evacuation can be carried out with the vacuum sources 44a, 44b (FIG. 4a) at a minimum of expense and in a minimum of time and also only minimal changes of the atmosphere $U_{31}$ result when an evacuated lock chamber is opened toward chamber 31.

Figure 5:
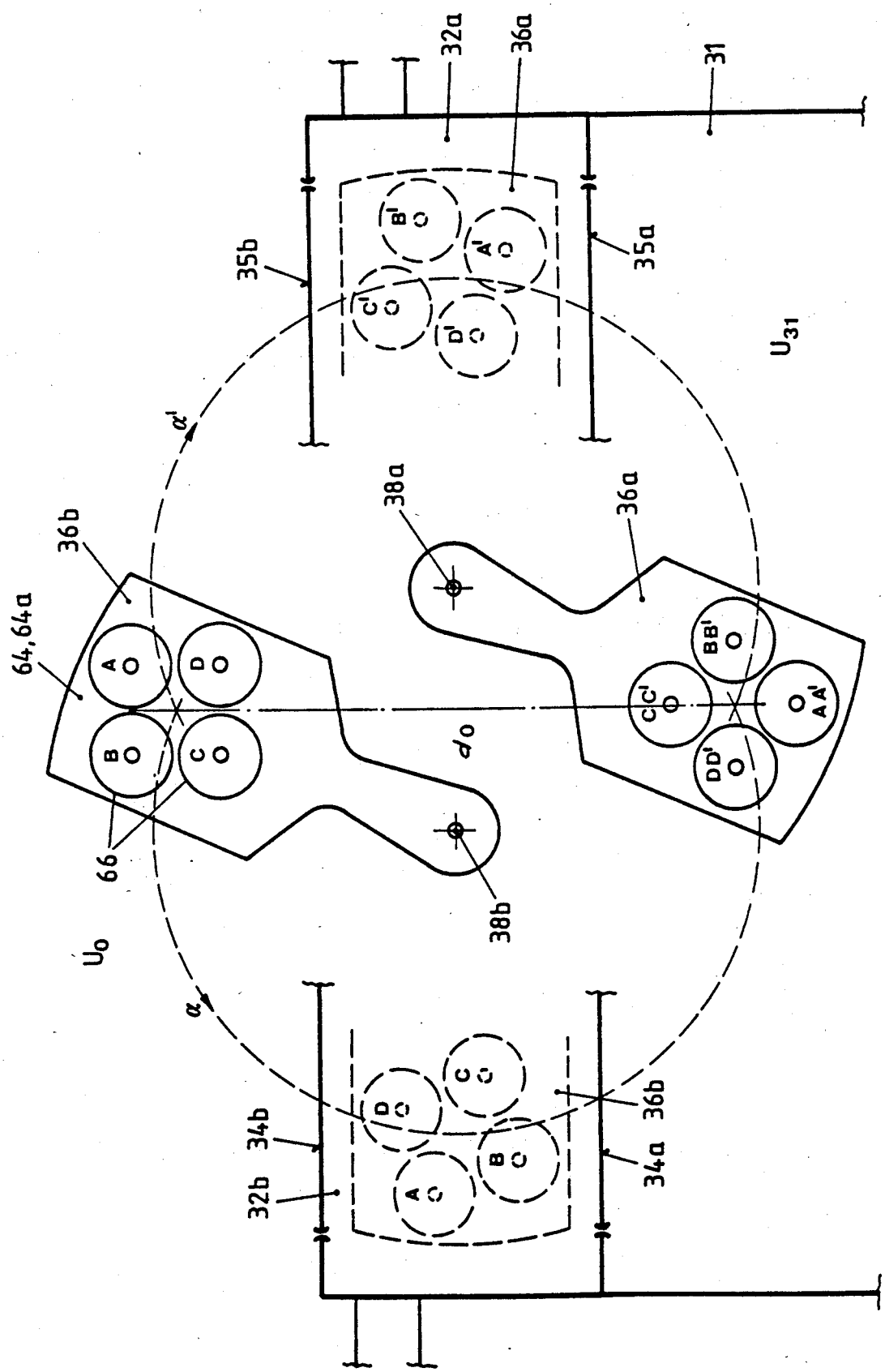
FIG. 5 is a schematic diagram of a lock chamber arrangement according to the invention for introducing workpieces into a treatment medium in the same orientation.

FIG. 5 is a schematic top view of a lock chamber arrangement according to the invention which is analogous to the one illustrated in FIGS. 4a to 4f. The same reference numerals as in FIGS. 4a to 4f are used in FIG. 5 to designate the same or similar parts. The workpieces 64, 64a to be conveyed between medium $U_0$ and the treatment chamber 31 here comprise in analogy to the discs 54, 54a of FIG. 4, four discs 66, which together constitute a workpiece in the sense of the present invention. In the arrangement of FIG. 5, the length of the levers 36a and 36b, the distance $d_0$ of their pivot axes 38a, 38b, and the amount of the angle of rotation alpha, alpha' from a common position in medium $U_0$ into a common position in medium $U_{31}$ are such that both in medium $U_0$ and, in particular, in medium 31, the treatment medium the workpieces 64 picked up and conveyed by the two levers have the same orientation. If the discs 66 on the levers shown in broken lines, received in medium $U_0$, are designated by A, B, C, D for observation of their trajectory, it is seen that via the position shown in broken lines in lock chamber 32b they are in the end introduced in position A, B, C, D shown again in solid lines in medium $U_{31}$ (see trajectory alpha). If, on the other hand the discs 66, analogously designated by A', B' C' and D', are picked up in medium $U_0$ by lever 36a, as shown in solid lines in FIG. 5 in medium $U_{31}$, they are brought upon rotation of this lever 36a, per trajectory alpha', with the same orientation as before by lever 36b, into the positions A', B', C' and D' in medium $U_{31}$. For certain treatment processes, as the vacuum coating of discs, this has the essential advantage that on being charged by the two levers the same conditions become effective in the treatment chamber 31.

While the specific embodiments of the invention has been shown and described in detail to illustrate the application of the principles of the invention, it will be understood that the invention may be embodied otherwise without departing from such principles.

We claim:

1. In a transport system for conveying a workpiece from a first medium into a second medium, the improvement wherein the conveying is done substantially without one medium affecting the other, comprising at least one lock chamber arrangement; said lock chamber arrangement comprising:

at least one transport lever having one arm, first and second ends and opposite length sides between said ends;

said arm being pivotally mounted at said first end to pivot around a pivot axis and having a workpiece receiving portion at said second end;

said transport lever being pivotable from a first position, through an intermediate position and to a second position around said pivot axis;

a lock chamber with wall means defining an interior enclosing said lever in its intermediate position;

said pivot axis of said lever being arranged eccentrically of said chamber and adjacent said wall means within said chamber;

said wall means comprising wall portions extending along both opposite length sides of said lever in its intermediate position, one of said wall portions being provided for separating the interior of said chamber from said first medium, the other of said wall portions being provided for separating said interior of said chamber from said second medium;

each of said wall portions comprising an opening through which said lever may pivot into its first and into its second positions respectively;

each of said openings being provided with a lock gate for opening and closing said openings respectively.

2. The system of claim 1 wherein said wall portions extending along said length sides of said lever and are spaced from each other to closely accommodate said lever in its intermediate position with a workpiece to be conveyed between said first and second positions being on said workpiece receiving portion.

3. The system of claim 1 wherein each of said lock gates comprises a slit valve.

4. The system of claim 3 wherein said lock gates each comprises a MONOVAT slit valve.

5. The system of claim 1 comprising a second lock chamber arrangement having at least one second transport lever with one second arm, first and second ends and opposite length sides between said ends of said second transport lever, said second arm being pivotally mounted at its first end to pivot around a second pivot axis, and having a second workpiece receiving portion at its second end, said second transport lever being pivotable from a first position thereof through an intermediate position thereof to a second position thereof around said second pivot axis, a second lock chamber with second wall means defining an interior enclosing said second lever in its intermediate position, said second pivot axis of said second lever being arranged eccentrictly and adjacent said second wall means within said second chamber and said second wall means comprising second wall portions extending along both opposite length sides of said second lever in its intermediate position and with each of said second wall portions having openings therethrough and second lock gates for opening and closing said openings through said second wall portions; one of second said wall portions separating an interior or said second chamber from one of said first and second media, the other of said second wall portions separating said interior of said second chamber from a third medium.

6. The transport system of claim 5 wherein said third medium is the same as one of said first and second media.

7. The system of claim 5 further comprising means for controlling the movement of, said lock gates of said at least one lock chamber arrangement and of the second lock gates, and of said lever of said one lock chamber arrangement, and of said second lever, so that said levers cooperate in push-pull fashion for conveying work pieces at least between said first and said second media.

8. The system of claim 5 wherein at least one of the first and second positions of receiving portion of said lever of said one lock chamber arrangement is at substantially the same location as at least one of the first and second positions of said receiving portion of said second lever of said second lock chamber arrangement.

9. The system of claim 8 wherein said first and second positions of said receiving portion of said lever of said one chamber arrangement is at least substantially equal in position to said first and said second positions of said receiving portion of said second lever of said second chamber arrangement.

10. The system of claim 5 wherein a pivot trajectory of said lever of said one chamber arrangement crosses a pivot trajectory of said second lever of said second chamber arrangement.

11. The system of claim 5 wherein said pivot axis of said one lock chamber arrangement and said second pivot axis of said second lock chamber arrangement are adjacent each other, said lever of said two chamber arrangement extending substantially away from each other from their respective pivot axes.

12. The system of claim 1 including valve means connected to said interior of said lock chamber for admitting and removing gas to and from said interior of said chamber.

13. The system of claim 1 including in combination at least one vacuum chamber connected to at least one of said wall portions of said wall means and containing one of said media.

14. The system of claim 1 said receiving portion of said lever is spoon-shaped.

15. The transport system of claim 1 said workpiece is a disc-shaped workpiece.

16. The system of claim 5 wherein a workpiece conveyed by said receiving portion of said lever of said one lock chamber arrangement from said first to said second positions thereof changes its absolute orientation in space the same way as a workpiece conveyed by said second lever of said second chamber arrangement when conveyed from said first to said second position of said second lever of said second chamber arrangement.

* * * * *